United States Patent
Mendenhall

(10) Patent No.: US 7,501,889 B2
(45) Date of Patent: Mar. 10, 2009

(54) METHOD AND APPARATUS FOR IMPLEMENTING SOFT SWITCHING IN A CLASS D AMPLIFIER

(75) Inventor: Eric Mendenhall, Dove Canyon, CA (US)

(73) Assignee: RGB Systems, Inc., Anaheim, CA (US)

( * ) Notice: Subject to any disclaimer, the term of this patent is extended or adjusted under 35 U.S.C. 154(b) by 197 days.

(21) Appl. No.: 11/309,349

(22) Filed: Jul. 28, 2006

(65) Prior Publication Data

US 2007/0115055 A1   May 24, 2007

Related U.S. Application Data

(63) Continuation-in-part of application No. 10/908,063, filed on Apr. 26, 2005, now Pat. No. 7,167,048.

(60) Provisional application No. 60/704,241, filed on Jul. 28, 2005, provisional application No. 60/565,261, filed on Apr. 26, 2004.

(51) Int. Cl.
*H03F 3/217* (2006.01)
(52) U.S. Cl. .................. 330/251; 330/207 A
(58) Field of Classification Search .......... 330/251, 330/207 A, 10, 146
See application file for complete search history.

(56) References Cited

U.S. PATENT DOCUMENTS

| | | | | |
|---|---|---|---|---|
| 5,117,198 A | * | 5/1992 | Morenz | 330/251 |
| 6,232,833 B1 | | 5/2001 | Pullen | |
| 6,304,137 B1 | | 10/2001 | Pullen et al. | |
| 6,388,514 B1 | * | 5/2002 | King et al. | 330/10 |
| 6,639,815 B1 | | 10/2003 | Gucyski | |
| 6,778,012 B2 | * | 8/2004 | Kirn | 330/10 |

FOREIGN PATENT DOCUMENTS

WO    WO 99/0379 A1    2/1999

* cited by examiner

*Primary Examiner*—Henry K Choe
(74) *Attorney, Agent, or Firm*—The Hecker Law Group, PLC

(57) ABSTRACT

The present invention provides lossless switching by configuring the output inductor so that the ripple current amplitude at load conditions results in small negative current during switching. The reconfigured output inductor results in increased ripple current amplitude. This increased ripple amplitude may be further controlled using zero ripple steering techniques to eliminate ripple at the output capacitor. A ripple steering technique involves adding a secondary output to the class D amplifier which steers the switching ripple away from the main output thus substantially relieving the main output from a major artifact of prior art Class D amplifiers.

10 Claims, 11 Drawing Sheets

METHOD AND APPARATUS FOR IMPLEMENTING SOFT SWITCHING IN A CLASS D AMPLIFIER

CROSS REFERENCE TO RELATED APPLICATIONS

This application claims priority of U.S. Provisional Application No. 60/704,241 filed on Jul. 28, 2005, entitled "Method and Apparatus for Implementing Soft Switching in a Class D Amplifier"; and is a Continuation-In-Part of U.S. application Ser. No. 10/908,063, filed on Apr. 26, 2005, entitled "Method and Apparatus for Reducing Ripple in Class D Amplifiers", now U.S. Pat. No. 7,167,048, which claims priority of U.S. Provisional Application No. 60/565,261 filed on Apr. 26, 2004, entitled "Class D Amplifier with Reduced Ripple and Increased Bandwidth," specifications of which are herein incorporated by reference.

FIELD OF THE INVENTION

The present invention relates to Class D amplifiers. More specifically, it relates to reduction of switching losses in Class D amplifier circuits.

BACKGROUND OF THE INVENTION

High quality audio power amplifiers are traditionally large, heavy, and inefficient. Typically these equipments are capable of high power audio output with very low total harmonic distortion (THD). However, these equipments achieve only approximately 25% efficiency under normal audio operating conditions because they typically use inefficient linear or quasi-linear amplifiers (e.g. Class A, B, G, and H).

In recent years, the demand for more efficient audio power amplifiers has increased. Thus the shift from Class B to Class D amplifiers for sound reproduction.

Class D amplifiers provide high efficiency, but typically have limited bandwidths, resulting in high THD at high audio frequencies.

A Class D amplifier is basically a switch-mode power supply modified to operate in four quadrants at high frequencies (e.g. audio frequencies). A switch-mode power supply uses pulse-width modulation (PWM) to control the ON/OFF duty cycle of power switching transistor(s) that provide power to a load. The efficiency is high because the switches are not operated in their linear region.

FIG. 1 is an illustration of a simplified Class D topology. As illustrated, a comparator circuit (not shown) inside the Pulse-Width Modulator 110 compares the amplitude of incoming analog audio signal 101 to the amplitude of a reference triangular waveform operating at an intended switching frequency. The comparator circuit switches its output high or low by comparing the incoming audio's amplitude against the amplitude of the triangular waveform. When audio signal 101 is above the amplitude of the triangular waveform, the comparator switches output D+ of the PWM 110 to the ON state. Output D+ remains ON for the duration of time while the input audio signal exceeds the amplitude of the triangular waveform. Conversely, while the input audio signal is below the amplitude of the triangular waveform, the output D+ of the PWM is at the OFF state. Output D− is the inverse, i.e., complementary of output D+.

The relationship between the input audio amplitude and the pulse-width modulator outputs D+, and D− is linear to a first order. The outputs D+ and D− of the comparator drive "totem-poled" transistor switches $Q_1$ and $Q_2$. Each transistor switch is a MOSFET device, with a diode device 131 coupled across its terminals to enable four quadrant switching. The topology shown in FIG. 1 is an example embodiment of a class D amplifier where the same type MOSFETs is used for both switches. Alternate embodiments include using complementary transistors, e.g. one p-type and one n-type MOSFET. For this reason the MOSFET symbol used shows no polarity.

Output filter 140 is typically a second order low-pass, e.g., LC configuration filter. The output filter 140 is essential for low pass filtering, or integrating, the carrier's varying pulse width duty cycle for reproduction of the original audio content while attenuating the switching carrier frequency.

For high fidelity audio reproduction, the operating (i.e. switching) frequency of the Class D power amplifier must be significantly higher than the bandwidth of the audio being reproduced. Thus, to reproduce higher bandwidth audio with higher fidelity requires relatively high switching frequency. However, the higher the switching frequency, the more the switching losses (i.e. reduced efficiency). Some causes of switching losses are discussed using the illustration in FIG. 2.

FIG. 2 is an illustration of a conventional Half Bridge Class D Amplifier with salient parasitic elements. As illustrated, voltage source $V_{gsQ1}$ drives the gate of transistor $Q_1$ and voltage source $V_{gsQ2}$ drives the gate of transistor $Q_2$. The illustration is a standard half-bridge showing parasitic elements $C_{Q1}$, which is the intrinsic capacitance of transistor $Q_1$; and $C_{Q2}$, which is the intrinsic capacitance of transistor $Q_2$. Element $D_1$ is either $Q_1$'s intrinsic diode or an external diode with lower drop; and element $D_2$ is either $Q_2$'s intrinsic diode or an external diode with lower drop. The currents and direction of flow (i.e. drain to source) are shown with the double arrows.

In this illustration, transistors $Q_1$ and $Q_2$ supply a quasi-square wave to the filter formed by output inductor $L_1$ and output capacitor $C_1$. Node 201, shared commonly by transistors $Q_1$, $Q_2$, and inductor $L_1$ is referred herein as the switching node. During operation, the voltage at switching node 201 is a square wave represented by waveform 310, as shown in FIG. 3. This voltage is low-pass filtered by the output LC filter comprised of inductor $L_1$ and capacitor $C_1$ to produce a relatively low frequency output voltage across capacitor $C_1$.

The inductor current ($I_{L1}$) at idle, that is, at zero output voltage, is represented by the triangular waveform 320 of FIG. 3. Triangular waveform 320 is a ripple current which produces a quasi-sinusoidal ripple voltage, i.e. waveform 330 of FIG. 3, on output capacitor $C_1$. This output ripple voltage, i.e. 330, must be limited in magnitude or there can be problems with radiated emissions. For this reason the value of the output inductor $L_1$ is kept high enough to limit the ripple current to some small fraction of the full power output current, typically 20% as a rule of thumb. FIG. 4 is an illustration of the relationship between ripple current and load current.

As illustrated in FIG. 4, the current at idle is shown by waveform 410 while the current at ⅛ power is shown by waveform 420. As shown in both waveforms 410 and 420, the ripple characteristic causes a non-steady disturbance in the output current about the steady state value. At idle, the average current is zero and the ripple characteristic of the Class D results in the non-steady negative and positive current oscillations. Since the amplitude of the oscillation (i.e. ripple) is controlled by the size of inductor $L_1$, similar ripple amplitude exists at other load values. For instance, as illustrated in waveform 420, the steady state current at ⅛ power is represented by the current value $I_{L1DC}$ and the ripple current superimposes thereon with ripple amplitude of approximately 20% peak to peak around the ⅛ power load current value $I_{L1DC}$.

Thus, although there are no intentionally dissipative elements in the circuit shown in FIG. 2, the practical circuit will not be 100% efficient because of a variety of finite loss mechanisms therein. For instance, there are inherent losses in the output LC filter and in the switching transistors. Losses in the filter section are well understood and chosen as a cost tradeoff, but losses in the transistors (FETs) have more constraints. Firstly, FETs $Q_1$ and $Q_2$ will have a finite ON resistance, leading to conduction loss. Secondly, $Q_1$ and $Q_2$ will experience some loss at switching transitions, leading to switching losses. It is these switching losses that primarily limit the switching frequency. Thus, even though a higher switching frequency (audio bandwidth) would be generally beneficial to audio performance, it also results in lower efficiency; therefore, prior art systems tradeoff bandwidth for efficiency.

With the approximately 20% current ripple of the prior art conventional Class D amplifier, a lossy (or hard) switching transition exists when output current is high. This lossy switching transition of the conventional Class D amplifier is illustrated using the waveforms of FIG. 14.

As illustrated, starting with $Q_2$ in the ON state (i.e. the gate supply voltage $V_{gsQ2}$ 1402 is greater than the threshold value) and a large positive current, $I_{L1}$ 1403, flowing through inductor $L_1$. The inductor current $I_{L1}$ 1403 flows through $Q_2$'s ON resistance from source to drain, which is a negative value represented by $I_{dsQ2}$ 1404.

At time t1, $Q_2$ is turned OFF and the inductor current $I_{L1}$ moves from $Q_2$'s ON resistance to $D_2$, which is either $Q_2$'s intrinsic diode or an external diode with lower drop. The voltage across $Q_2$, i.e. $V_{dsQ2}$ 1406, cannot rise until time t2, when $Q_1$ turns ON, but this will cause a large reverse recovery current ($I_{D2}$ 1405) to flow through $D_2$ and $Q_1$, since $D_2$ has a finite turn off time represented by the period between t2 and t3. Thus, the reverse recovery period lasts until time t3. Therefore, from t2 to t3, transistor $Q_1$ sees high current ($I_{D2}$ 1405) and high voltage ($V_{dsQ2}$ 1406) simultaneously, the product of which will be high switching loss (i.e. dissipated power).

Thus, improvement in efficiency can be realized with reduction in switching losses. Alternately, the switching frequency could be raised to realize improved performance without reducing efficiency. But this could not be done in conventional Class D amplifiers without increasing high frequency ripple.

Although the high frequency ripple is generally inaudible to the human ear, its presence is still undesirable for several reasons: (1) it is an emissions problem, for instance, it appears as artifacts in the AM radio band and other places; (2) it influences audio measurements; (3) provides a limitation on how clean the output signal looks to the end user; and (4) puts unwanted artifacts on a feedback signal fed to the control circuit, limiting the performance. Thus, any solution to reduce switching losses must also address high frequency ripple.

As discussed above, waveform 330 clearly shows the ripple phenomenon. In practice the voltage ripple on a full bandwidth class D amplifier can be on the order of one volt peak-to-peak with a fundamental of several hundred kHz, making it extremely prone to interfering with other electronic equipment, especially AM radio receivers. Modulation schemes in which the switching frequency is variable are particularly troublesome.

Prior art methods to reduce ripple includes using an LC series trap circuit across the output capacitor $C_1$. This approach has several disadvantages. First, the Q (quality factor) of the LC trap must be extremely high in order to effectively shunt current away from $C_1$, whose impedance at the switching frequency is already well below an Ohm. Second, the trap is only effective at a single frequency. The higher the Q, the less effective the trap will be if the switching frequency is variable. The trap is also not very effective at attenuating harmonics of the switching frequency; although these are usually 20 dB down from the fundamental in relative terms, they can still present problems if their magnitude is too large in absolute terms.

Another prior art method of reducing ripple would be to add another second order filter to the output, creating a fourth order filter. Some of the disadvantages of this method include that the inductor must be sized to handle the full output current, and the filter may add distortion due to nonlinearity in the devices used, and the filtered output is outside of the control of any feedback loop.

Another prior art method to handling the ripple problem is to add a second LC low-pass filter in the output thus effectively increasing the order of the output filter from two to four. However, fourth order filters pose controllability and linearity problems. In addition, the higher order filter increases the total harmonic distortion (THD).

The present invention teaches reduction of switching losses while reducing the effect of ripple to acceptable levels.

SUMMARY OF THE INVENTION

The invention is a method and apparatus for reducing switching losses in class D amplifiers. A Class D amplifier is basically a switch mode power supply driven by a high frequency modulator (e.g. a pulse width modulator). Thus, high frequency switching ripple (e.g. high frequency switching noise) is commonplace in conventional class D amplifiers. Because of the negative effects of high frequency ripple, including degradation in the audio reproduction, prior art Class D designs trade power loss (i.e. accept higher power loss) for reduced ripple by sizing the output inductor large enough to limit ripple to no more than 20% of the load current.

The high power loss (therefore reduced efficiency) is due to the transistors switching when the voltage and current are simultaneously at peak positive values resulting in power which must be dissipated. The high positive current is a product of the relatively large inductor value, which also limits the switching frequency bandwidth. Thus, embodiments of the present invention take advantage of the ripple at the switching transistors to significantly reduce the power loss thus allowing either an improvement in efficiency or increase in switching frequency, or both.

Furthermore, embodiments of the present invention apply coupled inductor methods to steer ripple away from the output of the class D amplifier thus eliminating any undesirable artifacts of the increased ripple in audio performance.

DETAILED DESCRIPTION OF THE INVENTION

The invention comprises a method and apparatus for reducing switching losses in Class D amplifiers. In the following description, numerous specific details are set forth in order to provide a more thorough description of the present invention. It will be apparent, however, to one skilled in the art, that the present invention may be practiced without these specific details. In other instances, well-known features have not been described in detail so as not to obscure the invention.

Figure 4:
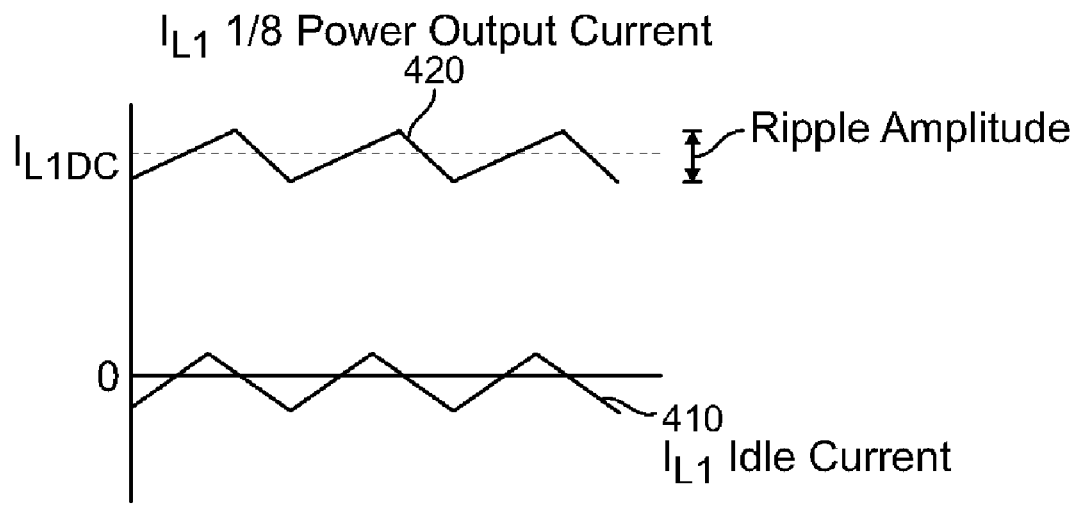
FIG. 4 is an illustration of the current waveforms at the output inductor of a typical class D amplifier configuration.
Figure 14:
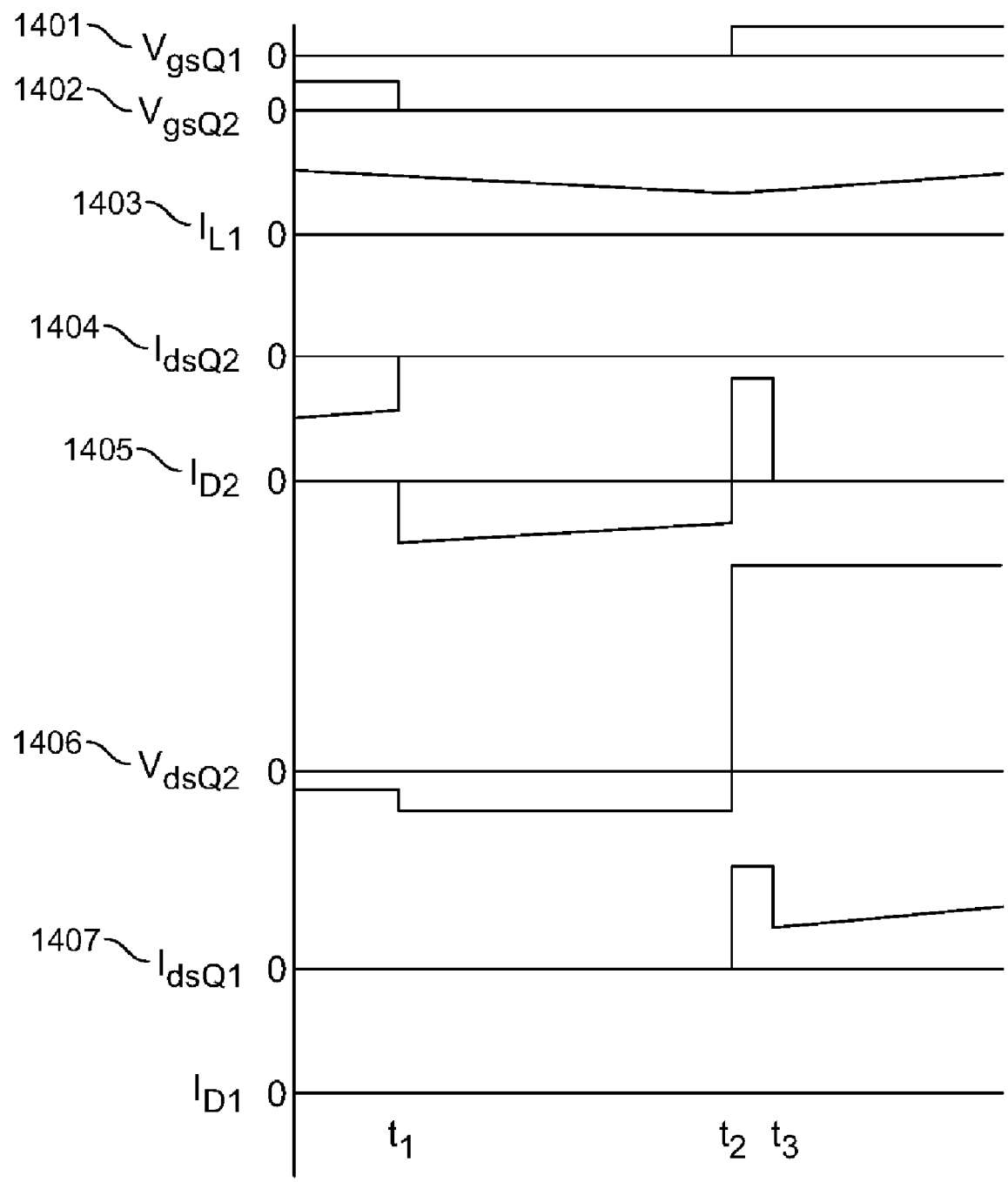
FIG. 14 is an illustration of the lossy switching characteristics of the conventional class D amplifier.

In general, embodiments of the present invention provide lossless switching class D amplifiers without the negative effects of ripple. Switching losses of prior art class D amplifiers (described with respect to $Q_1$ turning on against diode $D_2$) are only substantial due to the inductor current being positive at the time of transition (see waveform $I_{L1}$ 1403 in FIG. 14). Thus, if the inductor current were negative during this switching transition, $Q_2$ turn off would let the inductor current charge $C_{Q1}$ and $C_{Q2}$ causing the switching node voltage to resonantly increase until $D_1$ conducts. Thus, $Q_1$ would turn on without incurring reverse recovery loss, and without discharging the energy in $C_{Q1}$ and $C_{Q2}$ into $Q_1$. As illustrated in FIG. 4, negative current conditions for the conventional class D amplifiers only occur at, or very near, idle power conditions (i.e. waveform 410) and not during most load conditions (e.g. waveform 420).

Figure 15:
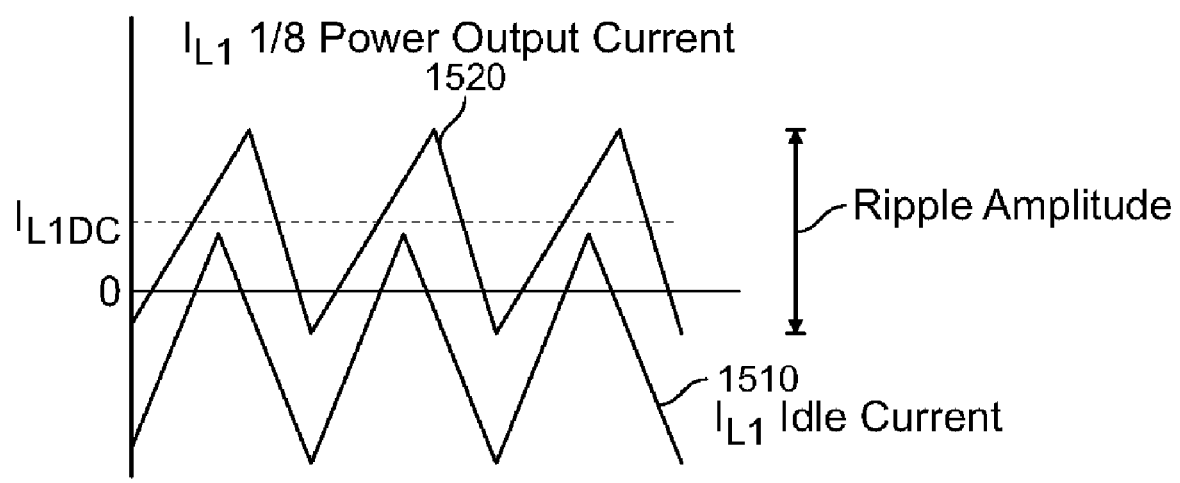
FIG. 15 is an illustration of the current waveforms at the output inductor of a class D amplifier of the present invention prior to ripple steering.

The range of output load current over which soft switching, that is, nearly lossless switching, can be obtained, may be increased by reducing inductor $L_1$ thereby increasing the inductor ripple current to a higher fraction of the load current, as illustrated in FIG. 15.

FIG. 15 is a waveform diagram illustration relationship between ripple and steady state current with reduced output inductance. The current at idle is represented by waveform 1510 while the current at full load is represented by waveform 1520. As illustrated, the ripple or peak-to-peak amplitude of the current oscillation is greater than the magnitude of the load current, which is represented by $I_{L1DC}$, resulting in instances of negative current at load. Thus, if switching occurs at instances of small negative inductor current, the dissipated power will be very minimal.

Figure 1:
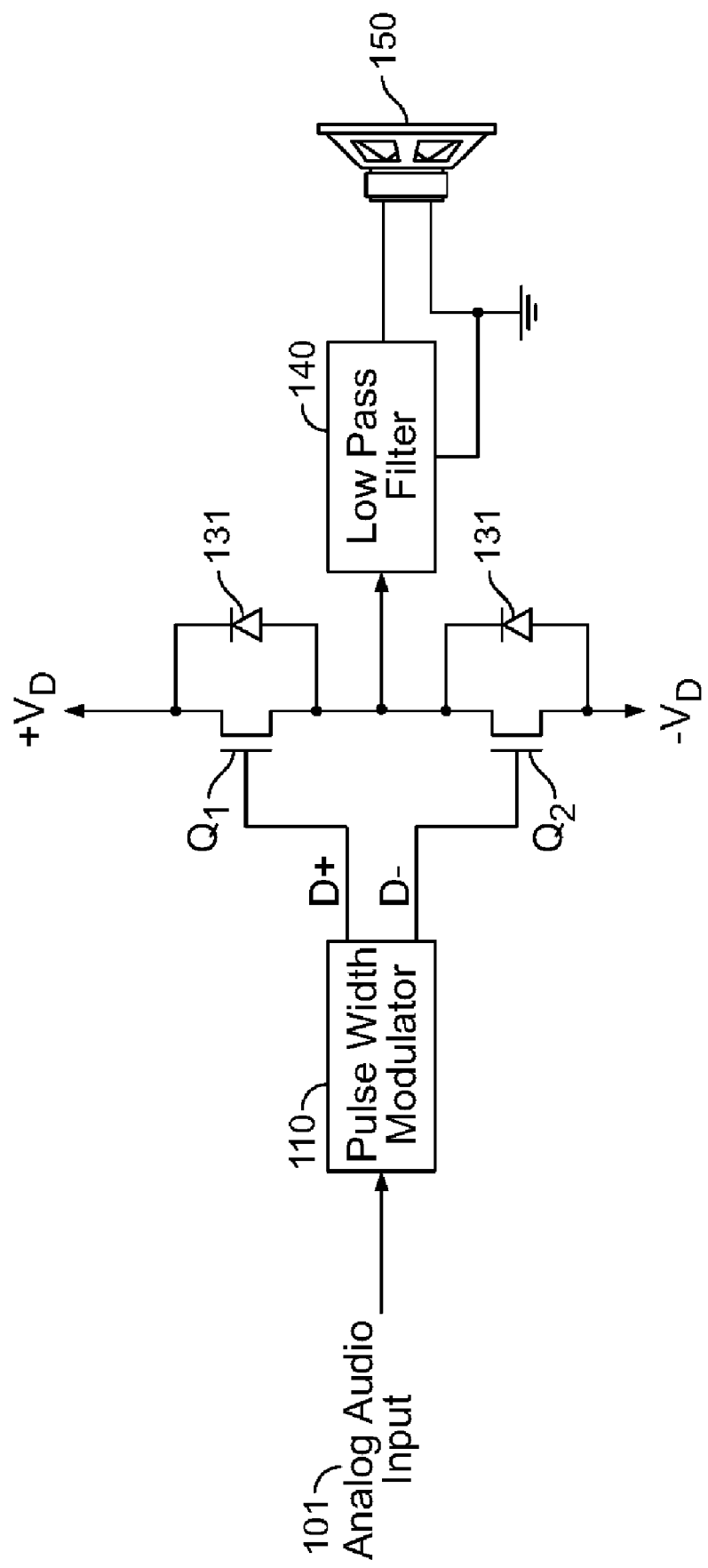
FIG. 1 is an illustration of a simplified Class D topology.
Figure 2:
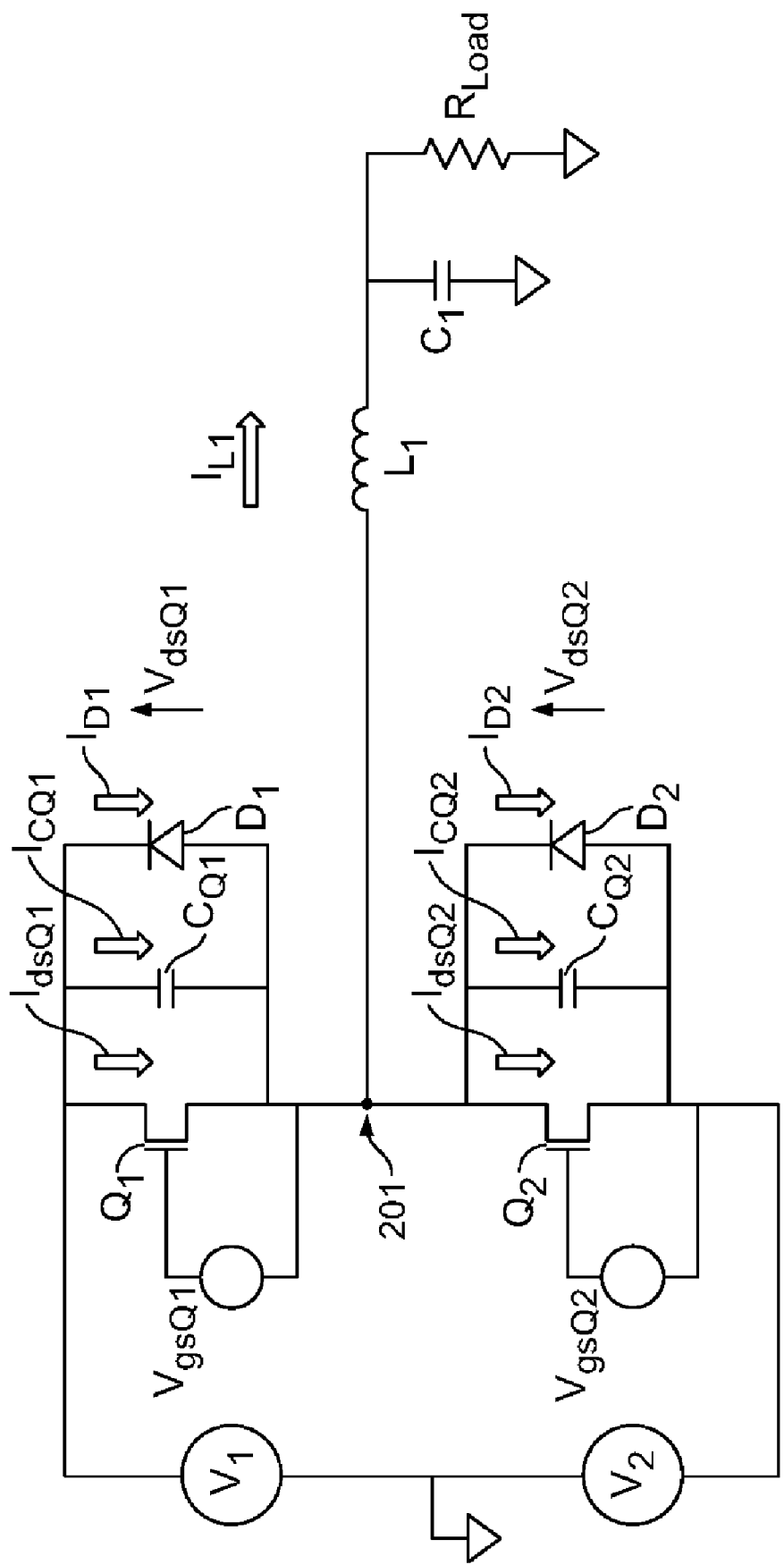
FIG. 2 is an illustration of a typical half bridge class D amplifier configuration with salient parasitic elements.
Figure 16:
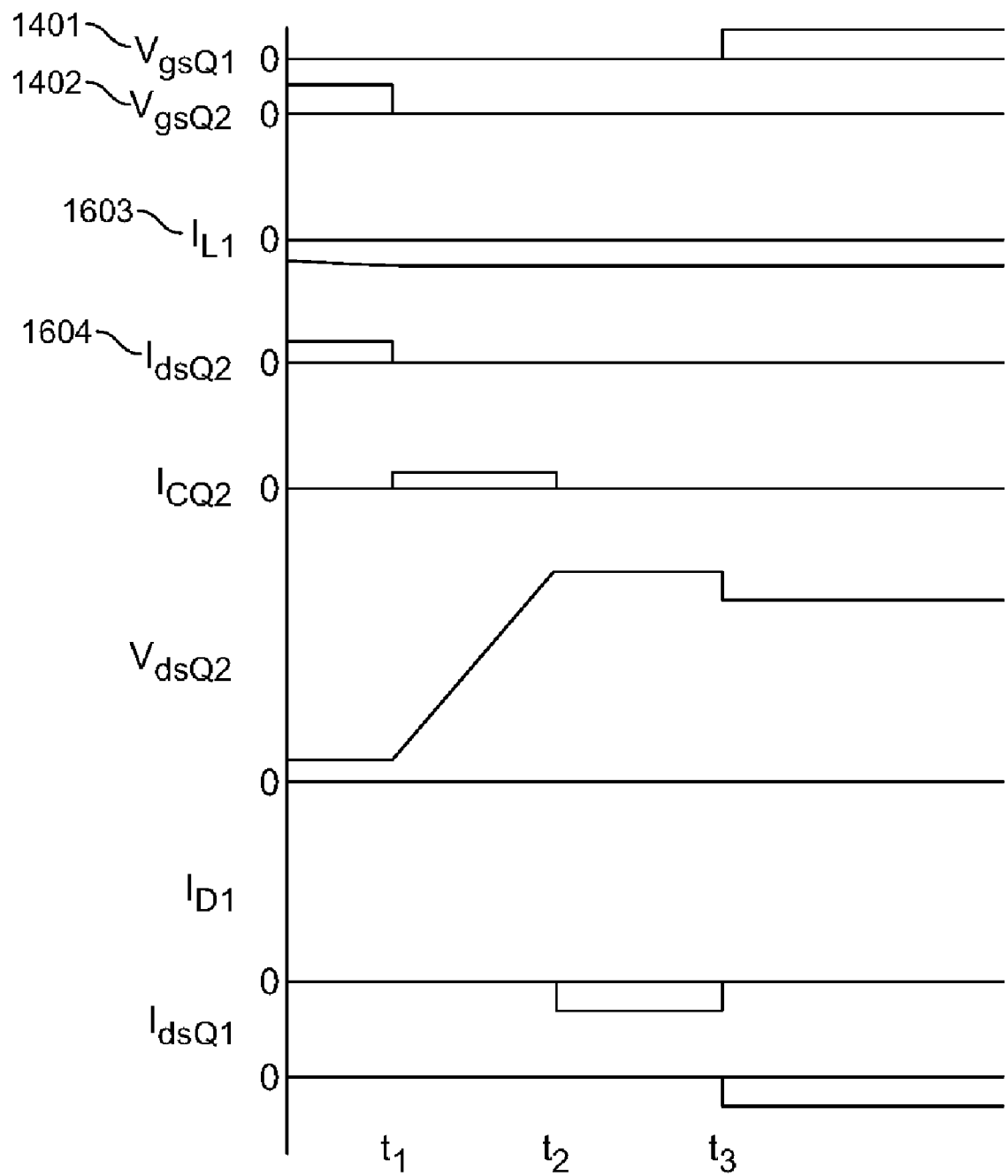
FIG. 16 is an illustration of the soft switching characteristics of the class D amplifier of an embodiment of the present invention.

There is a significant difference in power dissipation between conventional class D amplifiers and embodiments of the present invention because of the characteristic of the present invention which forces switching to occur with a small negative inductor current thus resulting in what is termed herein as "soft" switching over an extended range of output current as compared to the conventional class D amplifier. In the conventional class D amplifier, the switching is "hard" when output current exceeds a small value because of the large positive inductor current which occurs coincidentally with a large positive voltage across the transistor thus resulting in large power that must be dissipated. The soft switching operation of embodiments of the present invention is further illustrated using the waveforms of FIG. 16 and the class D configuration of FIG. 2.

Just as in the hard switched case, this illustration starts with transistor $Q_2$ in the ON state. That is, similar voltage waveforms $V_{gsQ2}$ 1402 and $V_{gsQ1}$ 1401 are applied at the gates of transistors $Q_2$ and $Q_1$, respectively, to illustrate the benefit of methods of the present invention over the prior art. As illustrated, the inductor current $I_{L1}$ 1603 in embodiments of the present invention is now a small negative value compared to inductor current $I_{L1}$ 1403 in the hard-switched case. This makes the drain to source current on transistor $Q_2$, i.e. $I_{dsQ2}$ 1604, a small positive current.

When transistor $Q_2$ is switched OFF at time t1, diode $D_2$ turns ON. Thus, the current is diverted to intrinsic capacitance $C_{Q2}$ (and $C_{Q1}$) where it is in the proper direction to charge these capacitances positively until $D_1$ conducts at time t2. At time t3, transistor $Q_1$ is turned ON and current is diverted from $D_1$ to $Q_1$. Thus, the interval of simultaneous high current and voltage across transistor $Q_1$ shown in the prior art example (see FIG. 5) does not exist. Therefore, switching loss is greatly reduced.

Thus, embodiments of the present invention provide a first order improvement in efficiency at the same switching frequency. Alternately, the switching frequency may be increased without an efficiency degradation using embodiments of the present invention.

However, increasing the ripple current by an order of magnitude results in corresponding increase in the ripple voltage on the output capacitor $C_1$. Since this ripple is in the order of magnitude of one volt for a conventional class D design, an increase in ripple voltage using embodiments of the present invention which may be in the order of magnitude of ten volts may be unacceptable for a variety of reasons, including radiated emissions and performance in the audio system. Thus, embodiments of the present invention control the increased ripple using the ripple steering techniques discussed herein.

Zero ripple is essentially achieved by adding an auxiliary output to the conventional class D amplifier. It is not necessary that the auxiliary output serve any other useful function except to remove the ripple from the main output. The half-bridge class D configuration has one auxiliary output while the full bridge circuit may have two auxiliary outputs, which may be combined into one in some embodiments. In the full-bridge zero ripple configuration, the second auxiliary output may be configured as a floating output.

Figure 5:
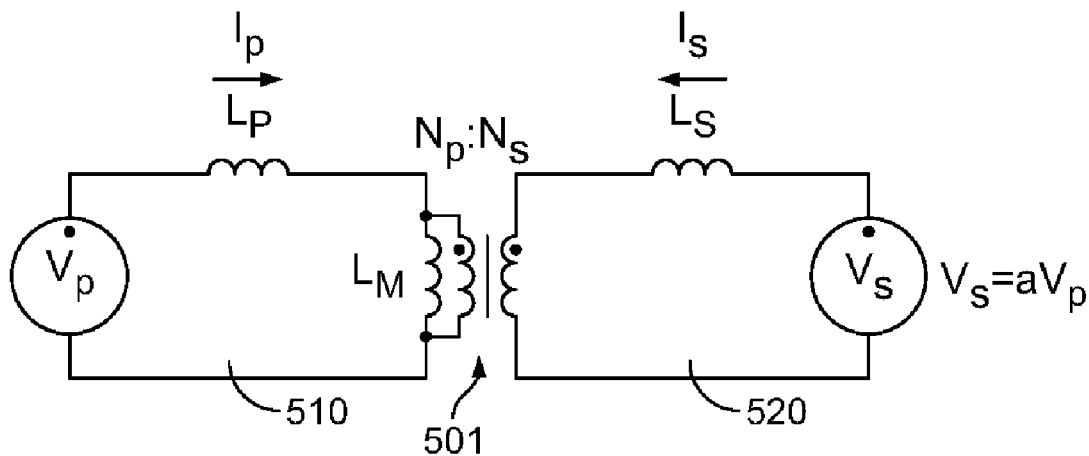
FIG. 5 is an illustration of a coupled inductor circuit as an ideal transformer with lumped parasitic elements being shown with two AC voltage sources connected.

In one or more embodiments of the present invention, a coupled inductor circuit is used to steer ripple away from the main output of the class D amplifier. To visualize how a coupled inductor circuit steers ripple away from a primary output, the coupled inductor is represented as an ideal transformer as shown in FIG. 5.

As illustrated, the principles of a coupled inductor 501 may be represented as an ideal transformer with turns ratio $N_P:N_S$. Where $N_P$ is the number of turns on the primary side winding and $N_S$ is the number of turns on the secondary side winding. The transformer has a finite magnetizing inductance $L_M$; a finite uncoupled inductance $L_P$ on the primary side 510; and a finite uncoupled inductance $L_S$ on the secondary side 520.

In practice, uncoupled inductance $L_S$ may be characterized as the combination of the coupled inductor leakage inductance and a larger discrete inductor. The two sides of the coupled inductor are driven with AC voltage sources, $V_P$ and $V_S$, where $V_S$ may be constrained to be a scalar multiple ("a") of $V_P$, e.g., $V_S=aV_P$. No other constraints need be imposed on $V_S$ and $V_P$, thus they may have any waveform and spectrum. These voltage sources create currents, $I_P$ and $I_S$, that flow into the coupled inductor 501. When the voltage across winding $N_P$ is equal to the primary source voltage $V_P$, then there is no voltage drop across uncoupled inductance $L_P$, and the primary side current $I_P$ is therefore equal zero.

Figure 6:
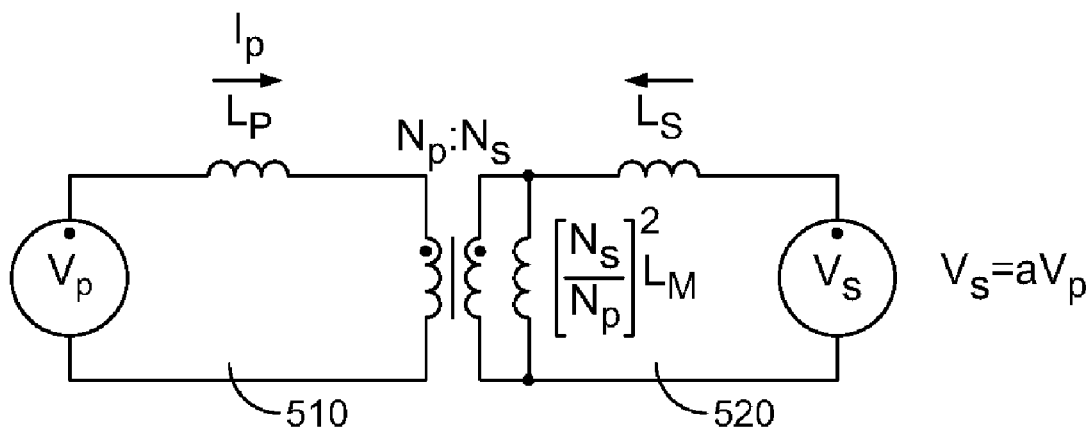
FIG. 6 is an illustration of the coupled inductor circuit redrawn to reflect $L_M$ to the secondary side for better visualization of the voltage divider.

When the secondary voltage source $V_S$ is scaled down by the voltage divider created by uncoupled inductance $L_S$ and the reflected magnetizing inductance $L_M$, then scaled up by the turns ratio $N_P:N_S$, it imposes a voltage on the primary winding $N_P$ that can be made equal to $V_P$, thus satisfying the zero ripple condition. FIG. 6 is an illustration of the coupled inductor circuit redrawn to reflect the magnetizing inductance $L_M$ to the secondary side 520 for better visualization of the voltage divider. Zero ripple condition will exist on the primary windings when the primary side voltage $V_P$ and secondary side voltage $V_S$ are equal so long as there is no voltage drop across the primary windings $N_P$, i.e., voltage on $N_P$ equals to primary side voltage $V_P$. The zero ripple condition is further illustrated below.

As shown in FIG. 6, the magnetizing inductance may be reflected to the secondary side 520 by a transformation equaling the square of the turns ratio. The voltage on the secondary winding $N_S$, denoted VNs, may be calculated with the resulting voltage divider as:

$$VNs = aVp \frac{Lm\left(\frac{Ns}{Np}\right)^2}{Ls + Lm\left(\frac{Ns}{Np}\right)^2}$$

The voltage across the primary winding $N_P$, denoted VNp, is calculated by transforming VNs by the turns ratio.

$$VNp = \left(\frac{Np}{Ns}\right)aVp\frac{Lm\left(\frac{Ns}{Np}\right)^2}{Ls + Lm\left(\frac{Ns}{Np}\right)^2}$$

Since the voltage across $N_P$ must equal $V_P$ for zero ripple, setting VNp to $V_P$ and simplifying terms gives:

$$Vp = \left(\frac{Np}{Ns}\right)aVp\left(\frac{Lm}{Ls\left(\frac{Np}{Ns}\right)^2 + Lm}\right)$$

Further simplifying and rearranging:

$$\left(\frac{Np}{Ns}\right)aLm = \left(\frac{Np}{Ns}\right)^2 Ls + Lm$$

And solving for $L_S$:

$$Ls = Lm\frac{\left(\frac{Np}{Ns}a - 1\right)}{\left(\frac{Np}{Ns}\right)^2}$$

Finally, solving for the case when a=1, that is, $V_S=V_P$:

$$Ls = Lm\left(\frac{Ns}{Np} - \left(\frac{Ns}{Np}\right)^2\right)$$

Under these conditions, zero ripple occurs at the primary winding. Thus, the coupled inductor approach is one way of solving the ripple problem with class D amplifiers. It would be obvious to those of ordinary skill in the arts that other magnetically equivalent methodologies and circuits may also be employed.

Figure 7:
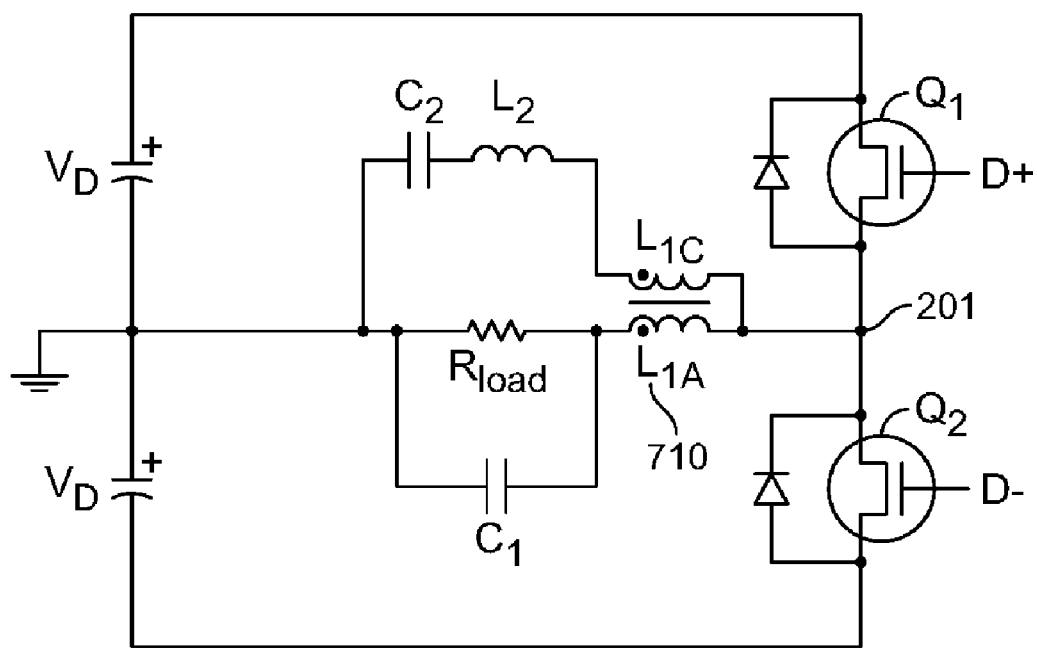
FIG. 7 is an illustration of the coupled inductor approach to ripple steering in the half-bridge configuration.

As is illustrated herein, one or more embodiments of the present invention employ the coupled inductor approach to eliminate ripple artifacts in class D amplifiers. FIG. 7 is an illustration of the coupled inductor approach to ripple steering in the half-bridge class D amplifier configuration. As illustrated, the main inductor 710 comprises a primary winding $L_{1A}$ and a coupled secondary winding $L_{1C}$ in parallel. A first end of both windings $L_{1A}$ and $L_{1C}$, i.e., shown as the end without the dot in FIG. 7, is coupled to switching node 201 (i.e., the connection of MOSFET switches $Q_1$ and $Q_2$). The second end of winding $L_{1A}$ is coupled to capacitor $C_1$, which is then coupled to ground. Thus, winding $L_{1A}$ and capacitor $C_1$ remain configured as the equivalent of the low-pass filter of the prior art (See FIG. 2) with an addition of an auxiliary output using secondary winding $L_{1C}$.

The secondary winding $L_{1C}$ of the coupled inductor 710 forms the basis of the auxiliary output comprising capacitor $C_2$, and inductor $L_2$ in which output capacitor $C_2$ is used primarily for diverting ripple away from the main amplifier (i.e. primary) output, at capacitor $C_1$. As illustrated, the second end of winding $L_{1C}$ is coupled to one end of inductor $L_2$, which is coupled to capacitor $C_2$. Finally, capacitor $C_2$ may be coupled to ground. Thus, capacitor $C_2$ steers ripple away from the primary output.

In this illustration, the low frequency voltages on the main output capacitor $C_1$ and the second output capacitor $C_2$ are identical, because both outputs track the DC value of the switching node 201. Assuming no substantial AC voltage is present on either output capacitor, the AC voltage at switching node 201 is analogous to both $V_P$ and $V_S$ as discussed with the illustration of FIGS. 5 and 6. Thus, this embodiment corresponds to the zero ripple condition on the primary windings since the primary side voltage $V_P$ and the reflected secondary side voltage across Np are equal.

Figure 8:
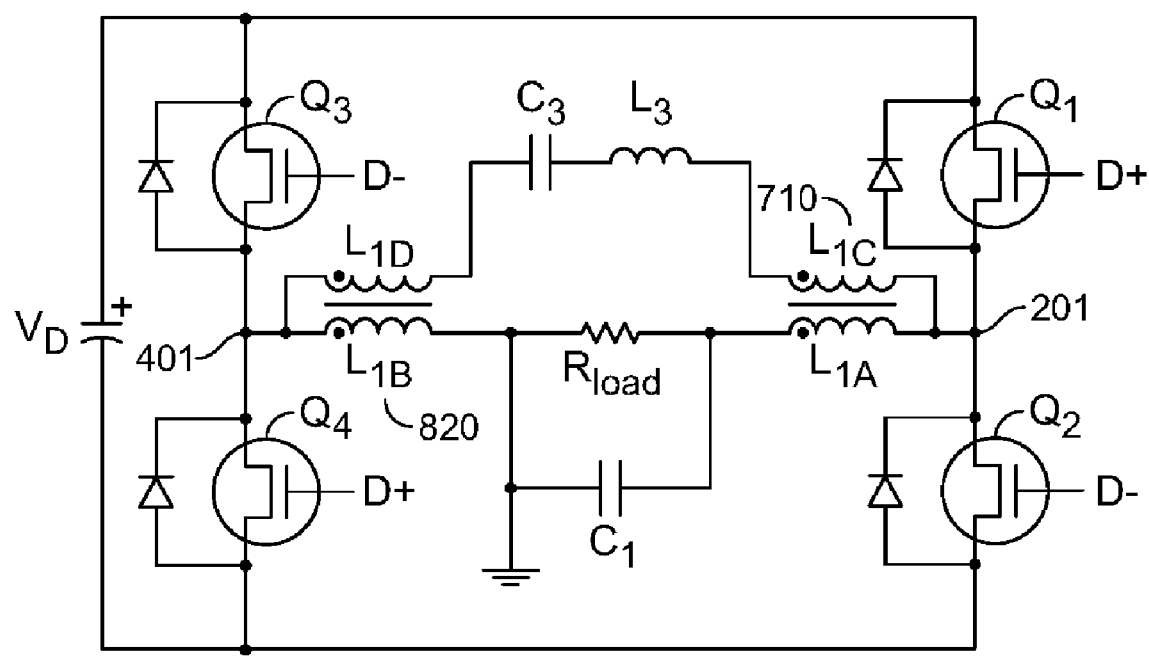
FIG. 8 is an illustration of the full bridge configuration of the coupled inductor embodiment to ripple steering.

FIG. 8 is an illustration of the full bridge configuration of the coupled inductor embodiment to ripple steering. As illustrated, the full bridge configuration involves mirroring the half-bridge architecture of FIG. 7 and combining the two sides. However, when two half bridge configurations are coupled together, the resulting circuit will have two $L_2$ inductors and two $C_2$ capacitors. In one or more embodiments of the present invention, the two resulting inductors $L_2$ are consolidated to create one inductor $L_3$ and the two resulting $C_2$ capacitors are consolidated into one capacitor $C_3$ as shown in FIG. 8.

As illustrated in FIG. 8, a first coupled inductor 710 comprising $L_{1A}$ and $L_{1C}$ is coupled at a first end to switching node 201. That is, the first end of winding $L_{1A}$ may be coupled together with the first end of winding $L_{1C}$ and then to switching node 201. A second coupled inductor 820 comprising $L_{1B}$ and $L_{1D}$ is coupled at a first end to switching node 401. Switching node 401 is the coupling point of MOSFET switches $Q_3$ and $Q_4$. The dot-orientation of both coupled inductors 710 and 820 are in the same direction and as shown in the illustration.

The second end of winding $L_{1A}$ of coupled inductor 710 is coupled to one end of capacitor $C_1$. The other end of capacitor $C_1$ is coupled to ground. In like manner, the second end of winding $L_{1B}$ of coupled inductor 820 is coupled to the other end of capacitor $C_1$, which is coupled to ground.

For the auxiliary outputs, the second end of winding $L_{1C}$ of coupled inductor 710 is coupled to one end of inductor $L_3$, which is coupled to one end of auxiliary output capacitor $C_3$. Finally, the other end of auxiliary output capacitor $C_3$ is coupled to the second end of winding $L_{1D}$ of coupled inductor 820.

Those of skill in the arts would recognize that the coupled inductor windings $L_{1A}$, $L_{1B}$, $L_{1C}$ and $L_{1D}$ may all exist on the same core as a single integrated magnetic structure, and only a single uncoupled inductor $L_3$ and secondary output capacitor $C_3$ are needed. Other embodiments may use two coupled inductors, for instance, $L_{1A}$-$L_{1C}$ and $L_{1B}$-$L_{1D}$.

Figure 9:
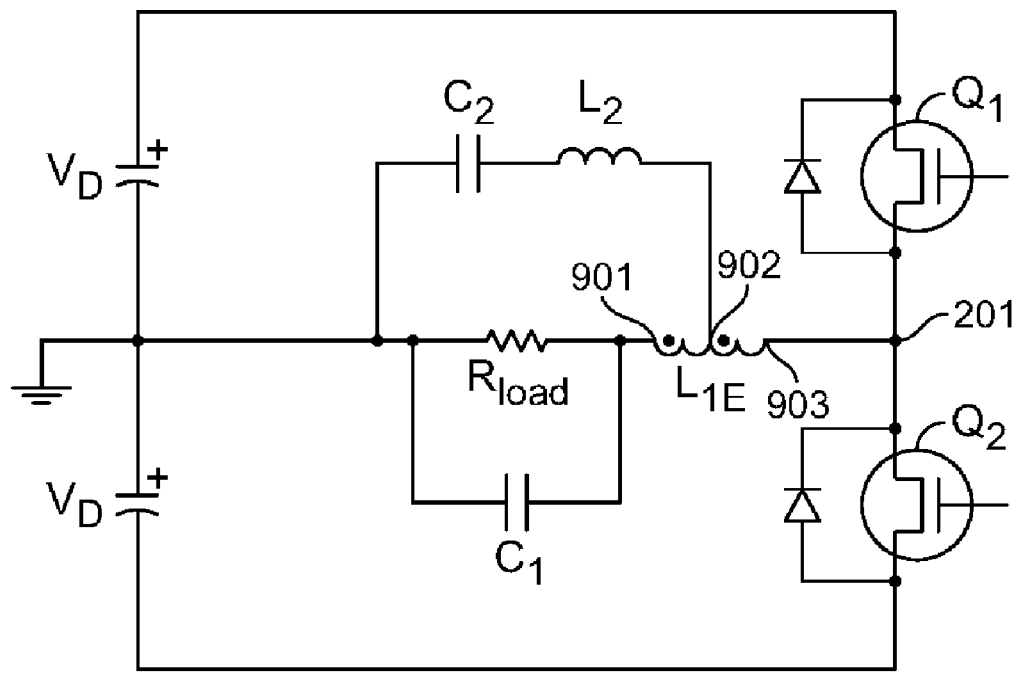
FIG. 9 is an illustration of a zero ripple half bridge configuration using a tapped inductor approach.
Figure 10:
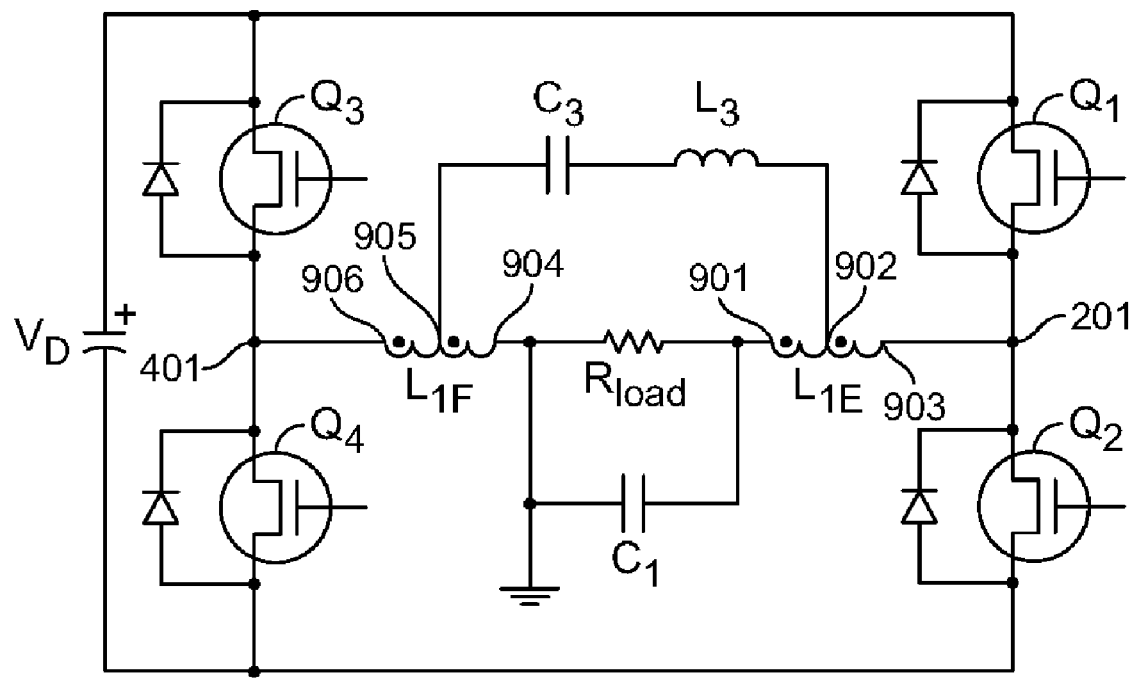
FIG. 10 is an illustration of the full bridge version of the tapped inductor embodiment to ripple steering.

Those of skill in the arts would recognize that there are other configurations that may be magnetically equivalent to those discussed with respect to the embodiments of FIGS. 7 and 8. That is, there may be magnetically other ways to achieve the same behavior discussed with respect to FIG. 7. For instance, since one side of both windings of the coupled inductor is coupled together at the same node, the voltage on the output side of the secondary inductor will be determined by the turns ratio. This voltage ratio may also be realized by the addition of a simple tap on the main inductor winding, as illustrated in FIGS. 9 and 10. This configuration may be an easier winding to manufacture than that discussed with respect to FIG. 7.

FIG. 9 is an illustration of a zero ripple half bridge configuration using a tapped inductor approach. As illustrated, the tapped inductor embodiment involves combining the number of turns that are equivalent between the primary and secondary windings. Thus, as illustrated, the embodiment comprises one inductor $L_{1E}$ with three pins 910, 902, and 903. Pin 903 at the first end of the inductor $L_{1E}$ is coupled to switching node 201. Pin 901 at the other end of inductor $L_{1E}$ is coupled to one end of main output capacitor $C_1$. The auxiliary output is tapped from pin 902 and coupled to inductor $L_2$ and auxiliary output capacitor $C_2$.

The principle of the tapped inductor configuration may be explained using the coupled inductor embodiment of FIG. 7. For example, if the number of turns in the primary windings (e.g. $N_P$) of the coupled inductor 710 is thirty and the number of turns in the secondary windings is twenty four (e.g. $N_S$), then the number of equivalent turns is twenty four. Using the above example, in embodiments that employ the tapped inductor configuration, the main inductor $L_{1E}$ (referring to FIG. 9) will have thirty turns between pins 901 and 903. A secondary tap is included at pin 902, which is located between pins 901 and 903 to represent the number of turns of the secondary winding of $L_{1C}$. In the current example, the tap at pin 902 is located such that there is twenty four turns between pins 902 and 903. Thus, instead of the two windings of the embodiment illustrated in FIG. 7, only one tapped winding may be utilized to magnetically achieve the same result.

FIG. 10 is an illustration of the full bridge version of the tapped inductor embodiment to ripple steering. As illustrated, the full bridge version involves mirroring the half-bridge architecture of FIG. 9 and combining the two sides. However, when two half bridge configurations are coupled together, the resulting circuit will have two $L_2$ inductors and two $C_2$ capacitors. In one or more embodiments of the present invention, the two resulting $L_2$ inductors are consolidated to create one inductor $L_3$ and the two resulting $C_2$ capacitors into one capacitor $C_3$ as shown in FIG. 10. Tapped inductor $L_{1F}$ has a plurality of pins, e.g., 904, 905, and 906. For instance, following the same example discussed above, the number of turns between pins 904 and 906 will be thirty and the number of turns between pins 905 and 906 will be twenty four.

Those of skill in the arts would recognize that the tapped inductor windings $L_{1E}$ and $L_{1F}$ may all exist on the same core as a single integrated magnetic structure, and only a single uncoupled inductor $L_3$ and a single auxiliary output capacitor $C_3$ are needed. Other embodiments may use two tapped inductors in separate cores, for instance, $L_{1E}$ and $L_{1F}$.

As further illustrated in FIG. 10, a first tapped inductor $L_{1E}$ is coupled at pin 903 to switching node 201. A second tapped inductor $L_{1F}$ is coupled at pin 906 to switching node 401. The dot-orientation of both tapped inductors $L_{1E}$ and $L_{1F}$ are in the same direction and as shown in the illustration.

Pin 901 of tapped inductor $L_{1E}$ is coupled to one end of capacitor $C_1$. The other end of capacitor $C_1$ is coupled to ground. In like manner, pin 904 of tapped inductor $L_{1F}$ is coupled to the other end of capacitor $C_1$, which is coupled to ground.

For the auxiliary outputs, pin 902 of tapped inductor $L_{1E}$ is coupled to one end of inductor $L_3$, which is coupled to one end of auxiliary output capacitor $C_3$. Finally, the other end of auxiliary output capacitor $C_3$ is coupled to pin 905 of tapped inductor $L_{1F}$.

Figure 11:
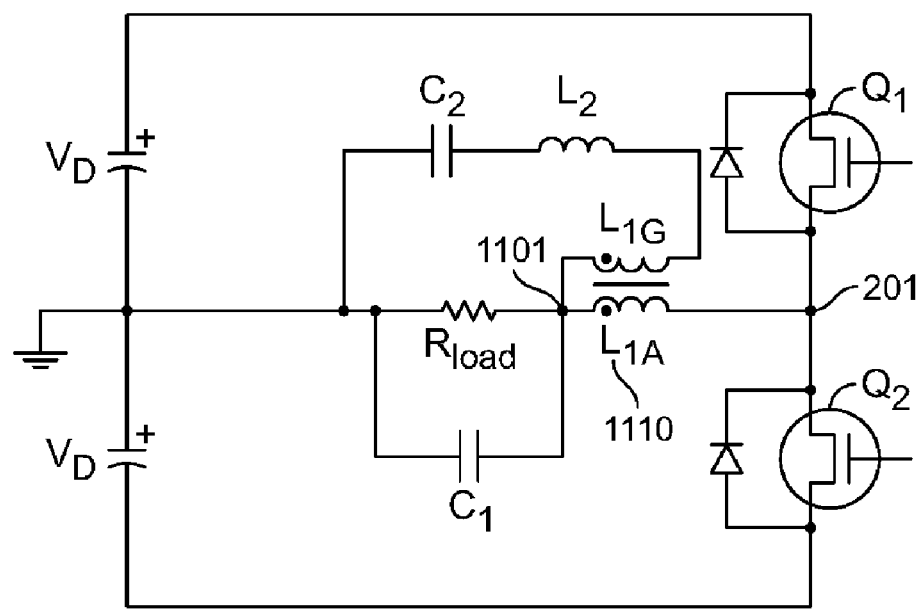
FIG. 11 is an illustration of a zero ripple half bridge class D amplifier using back-wound coupled inductor configuration.
Figure 12:
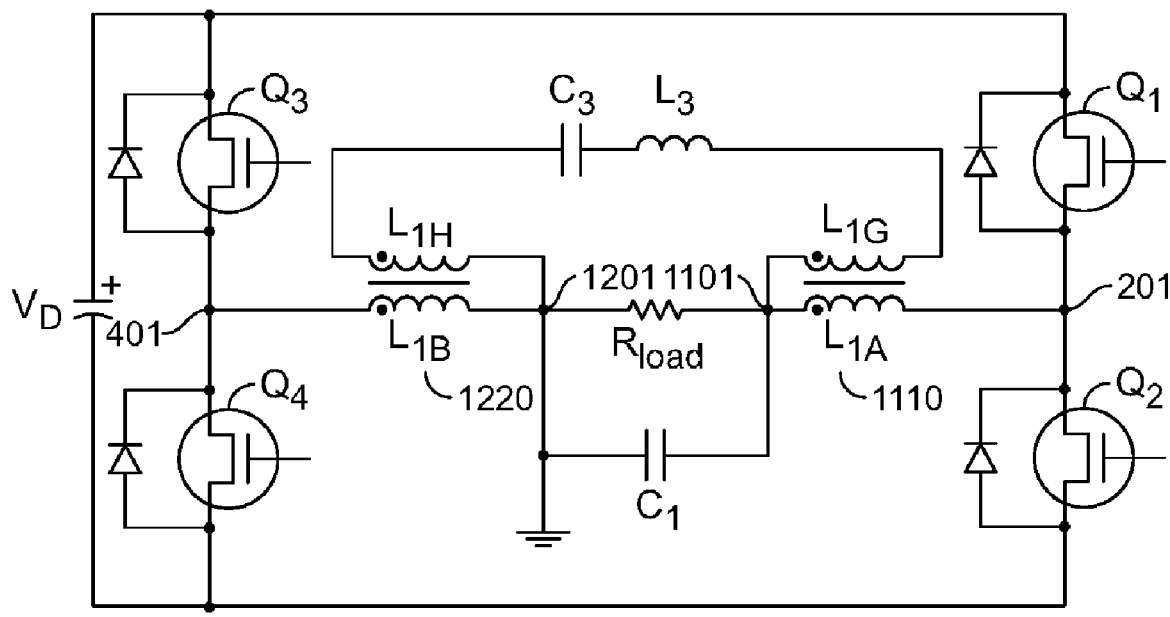
FIG. 12 is an illustration of the full bridge version of the alternate coupled inductor embodiment to ripple steering.

In another embodiment, a magnetically equivalent circuit involves coupling a winding for the auxiliary output to the output side of the main inductor, and winding backwards in a bucking fashion as shown in FIGS. 11 and 12. FIG. 11 is an illustration of a zero ripple half bridge class D amplifier using back-wound coupled inductor configuration. As illustrated, the main inductor 1110 has a primary winding $L_{1A}$ coupled as a normal class D circuit. That is, a first end of winding $L_{1A}$, i.e., shown as the end without the dot, is coupled to switching node 201 (i.e., the connection of MOSFET switches $Q_1$ and $Q_2$). The second end or output end of winding $L_{1A}$ is coupled to capacitor $C_1$, which is then coupled to ground. Thus, winding $L_{1A}$ and capacitor $C_1$ remain configured as the low-pass filter of the prior art (See FIG. 2).

The secondary winding $L_{1G}$ forms the basis of the auxiliary output comprising capacitor $C_2$, and inductor $L_2$ in which output capacitor $C_2$ is used primarily for diverting ripple away from the main amplifier output, at capacitor $C_1$. As illustrated, the second end of secondary winding $L_{1G}$ (the end with the dot) is coupled to the output end of inductor $L_{1A}$ (i.e. node 1101), and back-wound in the same core with winding $L_{1A}$ to the first end. The first end of winding $L_{1G}$ is coupled to one end of inductor $L_2$, which is coupled to capacitor $C_2$. Finally, capacitor $C_2$ may be coupled to ground. Thus, capacitor $C_2$ steers ripple away from the primary output.

Using the same example as before with the primary side inductor having thirty turns, the secondary side inductor $L_{1G}$ is back-wound six turns thus resulting in effectively twenty four turns. This configuration produces nearly the same effect as if twenty four turns of the secondary inductor were coupled to the switching node (see configuration of FIG. 7).

The embodiment illustrated in FIGS. 11 and 12 also produces the same voltage ratio, but with far fewer turns added, these turns optionally being of a much smaller ampacity with respect to the main winding. In addition, the back-wound method may be better for external leakage field reduction on the coupled inductor if a toroidal core is used. This is because the smaller bucking winding can occupy a smaller portion of the toroid circumference, such that each winding, $L_{1A}$ and $L_{1G}$, both have almost the ideal 360 degree winding coverage, which will reduce leakage flux.

FIG. 12 is an illustration of the full bridge version of the alternate coupled inductor embodiment to ripple steering. As in other embodiments discussed herein, the full bridge version involves mirroring the half-bridge architecture of FIG. 11 and combining the two sides. The secondary windings are coupled from the output nodes 1101 and 1201 instead of the switching nodes 201 and 401. When two half bridges are coupled together, the resulting circuit will have two inductors $L_2$ and two capacitors $C_2$. However, one or more embodiments of the present invention consolidates the two resulting $L_2$ inductors into one inductor $L_3$ and the two resulting $C_2$ capacitors into one capacitor $C_3$ as shown in FIG. 12. Those of skill in the arts would recognize that the coupled inductor windings $L_{1A}$, $L_{1B}$, $L_{1G}$ and $L_{1H}$ may all exist on the same core as a single integrated magnetic structure, and only a single uncoupled inductor $L_3$ and secondary output capacitor $C_3$ are needed. Other embodiments may use two coupled inductors, for instance, $L_{1A}$-$L_{1G}$ and $L_{1B}$-$L_{1H}$.

Figure 13:
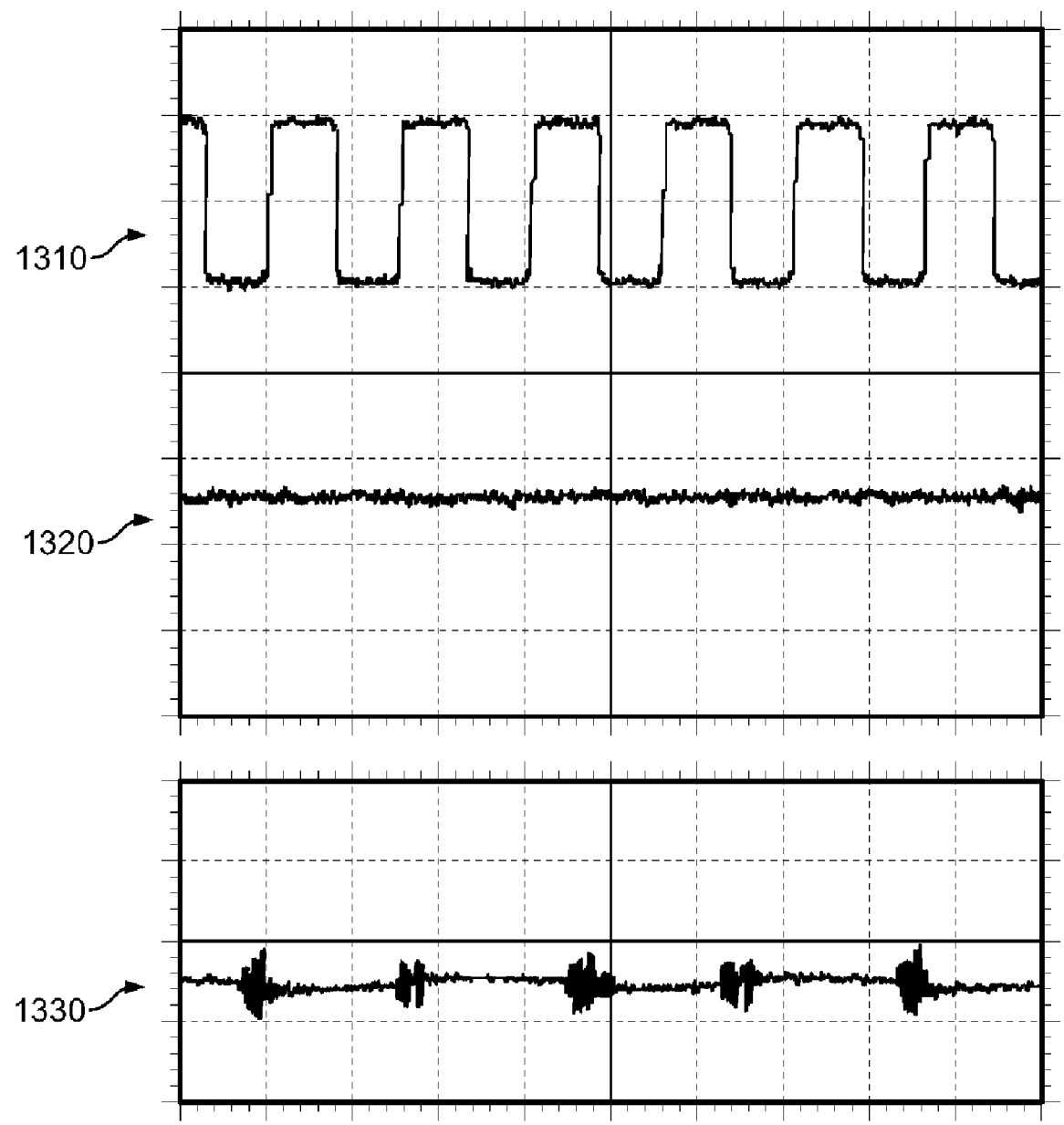
FIG. 13 is an illustration of sample waveforms of a zero ripple class D amplifier in accordance with an embodiment of the present invention.

FIG. 13 is an illustration of sample waveforms of a zero ripple class D amplifier in accordance with an embodiment of the present invention. The waveforms are from a full bridge zero ripple embodiment (see FIG. 8) running at 130 kHz from a 100-200 VDC supply. The class D circuit is optimized for high power and low audio bandwidth and is similar to the circuit used for generation of the waveforms illustrated in FIG. 3 for the prior art. The main class D output filter is comprised of a 200 uH inductor $L_1$ and a 5 uF film capacitor $C_1$. The zero ripple winding comprises $N_P$=30, $N_S$=24, $L_M$=200 uH, resulting in a secondary side uncoupled inductance $L_S$=32 uH. The secondary side uncoupled inductance $L_S$ comprises approximately 7 uH leakage inductance and 25 uH discrete inductance, e.g., $L_3$. Auxiliary output capacitor $C_3$ may be varied within a wide range (e.g. from 5 uF to 1 uF) with no impact on the operation of the zero ripple class D amplifier.

Figure 3:
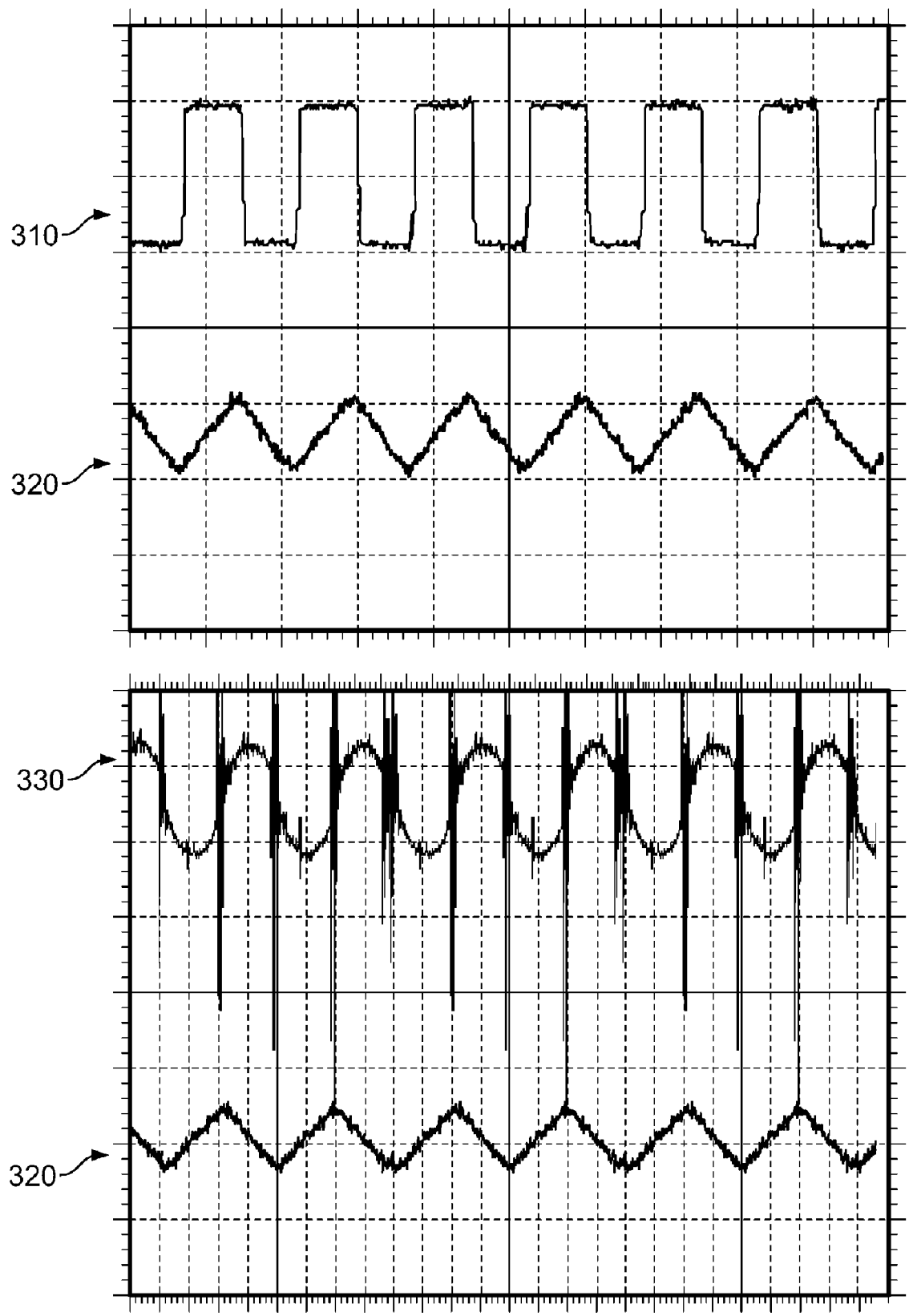
FIG. 3 is an illustration of the waveforms of a prior art class D amplifier showing output ripple.

As illustrated, a square wave voltage 1310 is generated across inductor $L_{1A}$ as a result of the modulator 110 driving the gates of transistors (MOSFETs) $Q_1$ and $Q_2$. The current at the output of inductor $L_{1A}$ is shown as waveform 1320. And finally, the voltage output at capacitor $C_1$ is shown as waveform 1330. In contrast to waveform 330 of FIG. 3 (prior art class D), the ripple characteristic is all but eliminated from waveform 1330. The plots in both FIG. 3 and FIG. 13 are of the same scale.

Note that the values of inductance and capacitance used herein are for illustrative purposes only. Specifically, the circuit used to generate the waveforms of FIG. 13 was optimized for high power and low bandwidth, and thus has a relatively low switching frequency of 130 kHz. And the values of inductance and capacitance reflect this low switching frequency. These values may be much larger than low power full bandwidth circuits applications.

In addition, an additional resonance may exist in the open loop transfer function of the zero ripple Class D amplifier implementation. This additional resonance may be due to the additional inductor and capacitor in the auxiliary output path. This additional resonance may cause a problem when trying to control the system with feedback. Thus, it may be desirable to move the resonance as close to the switching frequency as possible, i.e., out of the way of the closed loop system.

Referring to the half-bridge class D embodiments, the value of the auxiliary output capacitor $C_2$ (e.g. $C_3$ for the full-bridge) is at its lower limit when the switching voltage ripple on $C_2$ interferes with zero ripple operation. Thus simply adjusting $C_2$ may not be adequate to shift the additional resonance to a desirable frequency (e.g. the switching frequency). However, the resonance can also be moved by simultaneously moving the number of turns in the secondary winding $N_S$ very close to the number of turns in the primary winding $N_P$ and decreasing the resonant inductor value. In this manner the resonance may be moved to a much higher frequency with little effect on zero ripple Class D amplifier operation.

Application of the zero ripple technique herein allows use of the much higher ripple current amplitude which is necessary to achieve soft switching without increasing the output voltage ripple to an unacceptable level.

It will be understood that the above described arrangements of apparatus and the method therefrom are merely illustrative of applications of the principles of this invention and many other embodiments and modifications may be made without departing from the spirit and scope of the invention as defined in the claims.

What is claimed is:

1. A class D amplifier comprising:
   a first set of switches coupled together to form a first switching node;
   an output inductor circuit coupled to said first switching node, wherein said output inductor is sized to provide a ripple current amplitude resulting in instances of negative current at non-idle power conditions;
   an output filter comprising an output capacitor and said output inductor; and
   a ripple steering circuit to steer said ripple current away from said output capacitor.

2. The class D amplifier of claim 1, wherein each of said first set of switches comprises a transistor.

3. The class D amplifier of claim 1, wherein said first set of switches is driven by a modulator.

4. The class D amplifier of claim 1, wherein said ripple current amplitude provides soft switching up to a desired steady state power condition for a fixed load.

5. The class D amplifier of claim 4, wherein said fixed load ⅛ power condition.

6. A method for reducing switching losses in class D amplifiers comprising:
   coupling a first set of switches together to form a first switching node;
   coupling an output inductor circuit to said first switching node, wherein said output inductor is sized to provide a ripple current amplitude resulting in instances of negative current at non-idle power conditions;
   coupling an output capacitor to said output inductor and to ground; and
   coupling a ripple steering circuit to said output inductor circuit to steer said ripple current away from said output capacitor.

7. The method of claim 6, wherein each of said first set of switches comprises a transistor.

8. The method of claim 6, wherein said first set of switches is driven by a modulator.

9. The method of claim 6, wherein said ripple current amplitude results in soft switching up to a desired steady state power condition for a fixed load.

10. The method of claim 9, wherein said fixed load ⅛ power condition.

* * * * *